US006958286B2

(12) United States Patent
Chen et al.

(10) Patent No.: US 6,958,286 B2
(45) Date of Patent: Oct. 25, 2005

(54) METHOD OF PREVENTING SURFACE ROUGHENING DURING HYDROGEN PREBAKE OF SIGE SUBSTRATES

(75) Inventors: Huajie Chen, Danbury, CT (US); Dan M. Mocuta, Lagrangeville, NY (US); Richard J. Murphy, Clinton Corners, NY (US); Stephan W. Bedell, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/751,208

(22) Filed: Jan. 2, 2004

(65) Prior Publication Data

US 2005/0148161 A1    Jul. 7, 2005

(51) Int. Cl.$^7$ ..................... H01L 21/28; H01L 21/3205
(52) U.S. Cl. ..................... 438/602; 438/604; 438/607; 438/752; 438/753; 438/933
(58) Field of Search ................................ 438/584, 602, 438/604, 607, 933, 752, 753

(56) References Cited

U.S. PATENT DOCUMENTS

| 5,397,738 A | 3/1995 | Takagi |
| 6,106,613 A | 8/2000 | Sato et al. |

(Continued)

OTHER PUBLICATIONS

"Dedicated Pre-Clean Reduces Epi's Thermal Budget", Arkadii V. Samoilov, Dale Du Bois, Paul B. Comita & David Carlson, Applied Materials Inc., Santa Clara, CA, Nov. 1, 2000, 6 pages http://www.e-insite.net/semiconductor/index.asp?layout=articlePri. . . .

Primary Examiner—Amir Zarabian
Assistant Examiner—Thanh Y. Tran
(74) Attorney, Agent, or Firm—McGinn & Gibb, PLLC; Jay H. Anderson, Esq.

(57) ABSTRACT

The invention forms an epitaxial silicon-containing layer on a silicon germanium, patterned strained silicon, or patterned thin silicon-on-insulator surface and avoids creating a rough surface upon which the epitaxial silicon-containing layer is grown. In order to avoid creating the rough surface, the invention first performs a hydrofluoric acid etching process on the silicon germanium, patterned strained silicon, or patterned thin silicon-on-insulator surface. This etching process removes most of oxide from the surface, and leaves a first amount of oxygen (typically $1 \times 10^{13} - 1 \times 10^{15}/cm^2$ of oxygen) on the silicon germanium, patterned strained silicon, or patterned thin silicon-on-insulator surface. The invention then performs a hydrogen pre-bake process which heats the silicon germanium, patterned strained silicon, or patterned thin silicon-on-insulator surface sufficiently to remove additional oxygen from the surface and leave a second amount of oxygen, less than the first amount, on the silicon germanium, patterned strained silicon, or patterned thin silicon-on-insulator surface. The heating process leaves an amount of at least $5 \times 10^{12}/cm^2$ of oxygen (typically, between approximately $1 \times 10^{13}/cm^2$ and approximately $5 \times 10^{13}/cm^2$ of oxygen) on the silicon germanium, patterned strained silicon, or patterned thin silicon-on-insulator surface. By leaving a small amount of oxygen on the silicon germanium, patterned strained silicon, or patterned silicon-on-insulator surface, the heating processes avoid changing the roughness of the silicon germanium, patterned strained silicon, or patterned thin silicon-on-insulator surface. Then the process of epitaxially growing the epitaxial silicon-containing layer on the silicon germanium, patterned strained silicon, or patterned silicon-on-insulator surface is performed.

20 Claims, 2 Drawing Sheets

U.S. PATENT DOCUMENTS

| | | |
|---|---|---|
| 6,251,751 B1 | 6/2001 | Chu et al. |
| 6,348,420 B1 | 2/2002 | Raaijmakers et al. |
| 6,375,749 B1 | 4/2002 | Boydston et al. |
| 6,444,591 B1 | 9/2002 | Schuegraf et al. |
| 2002/0098627 A1 | 7/2002 | Pomarede et al. |
| 2002/0124867 A1 * | 9/2002 | Kim et al. .................. 134/1.2 |
| 2003/0036268 A1 | 2/2003 | Brabant et al. |
| 2004/0033639 A1 * | 2/2004 | Chinn et al. .................. 438/59 |

* cited by examiner

METHOD OF PREVENTING SURFACE ROUGHENING DURING HYDROGEN PREBAKE OF SIGE SUBSTRATES

CROSS-REFERENCE TO RELATED APPLICATION

The present application is related to a new U.S. patent application, filed concurrently, to Chen et al., entitled "A METHOD OF PREVENTING SURFACE ROUGHENING DURING HYDROGEN PRE-BAKE OF SIGE SUBSTRATES USING CHLORINE CONTAINING GASES", having Ser. No. 10/751,207, assigned to the present assignee, and incorporated herein by reference.

BACKGROUND OF THE INVENTION

1. Field of the Invention

The invention generally relates to the growth of epitaxial silicon (Si) or silicon germanium ($Si_xGe_{1-x}$, for simplicity, we use SiGe in the following description) on various semiconductor crystal surfaces and more particularly to an improved method that reduces the amount of oxygen on the semiconductor crystal surfaces, without roughening the surfaces.

2. Description of the Related Art

The surfaces of Si wafers normally become covered with a thin native oxide layer when exposed for more than a few minutes in an oxygen-containing environment. In epitaxial processes, the residual oxide (or oxygen contamination) on the surface of the substrate must be minimized to enable the growth of high-quality epitaxial films. Additionally, if the active region of an electrical device fabricated on the substrate is close to the epitaxial growth interface, residual oxygen at the interface may affect the operation or performance of the device. The invention described below reduces the amount of residual oxygen without substantially roughening the surface.

SUMMARY OF THE INVENTION

The invention forms an epitaxial Si layer on a SiGe surface, and avoids creating a rough surface upon which the epitaxial Si layer is grown. In order to avoid creating the rough surface, the invention first performs an HF etching process on the SiGe surface. This etching process removes most of the oxide from the surface, and leaves a first amount of oxygen (typically a dose of $1 \times 10^{13} - 1 \times 10^{15}/cm^2$ oxygen) on the SiGe surface. The invention then performs a hydrogen pre-bake process which heats the SiGe surface sufficiently to remove additional oxygen from the SiGe surface and leave a second amount of oxygen, less than the first amount, on the SiGe surface. The heating process leaves at least $5 \times 10^{12}/cm2$ oxygen on the SiGe surface. By leaving a small amount of oxygen on the SiGe surface, the heating processes avoid roughening the SiGe surface. Then the process of epitaxially growing the silicon layer on the silicon germanium surface is performed.

While only Si epitaxy on SiGe is described above, this invention is also applicable to SiGe epitaxy on SiGe, Si or SiGe epitaxy on patterned strained Si (such as with shallow trench isolation formed in the wafer), and Si or SiGe epitaxy on patterned thin SOI with Si thickness less than approximately 300 Å.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the nonlimiting embodiments that are detailed in the following description. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The present invention generally relates to Si epitaxy on a SiGe surfaces that are normally coated with a thin oxide after experiencing an ambient environment. In epitaxial processes, it is important to reduce the amount of oxide on the substrate for a high quality epitaxial film to be grown. If the surface oxygen content is high enough, it will detrimentally affect the growth of any epitaxial silicon on the silicon germanium layer.

A typical method for removing residual surface oxygen from Si substrates and for high-quality Si and SiGe epitaxy, is annealing the substrate at high temperature (>1000° C.) in a hydrogen atmosphere (hydrogen pre-bake). Alternatively, hydrogen pre-bake can be combined with an ex-situ hydrofluoric acid (HF) etch of the substrate prior to loading it into the epitaxy chamber. The HF etch will passivate the surface with Si—H bonds, which slows down the native oxide growth. Only a moderate hydrogen pre-bake ($\leq 900°$ C., 30 sec–120 sec) is required to remove the remaining oxide following the HF etch.

However, in the development of strained Si materials, it is often required to deposit Si on partially or fully relaxed SiGe. The relaxed SiGe has a larger lattice constant than Si. As a result, Si grown on top of this relaxed SiGe is under tensile strain. CMOS transistors built on strained Si have shown improved performance, due to higher electron and hole mobilities. Strained Si is a promising material for next generation high performance CMOS circuits.

Figure 1:
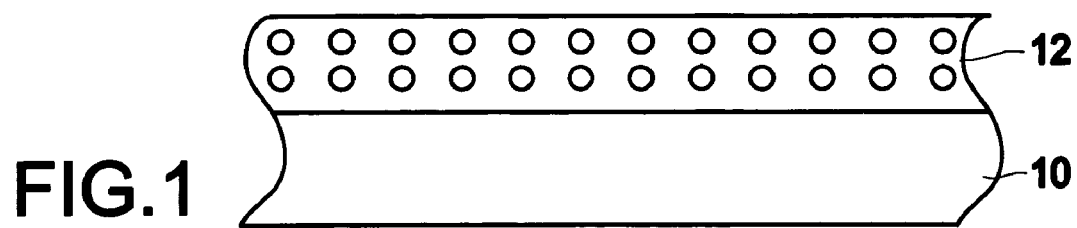
FIG. 1 is a cross-sectional schematic diagram of a partially completed layered structure.
Figure 2:
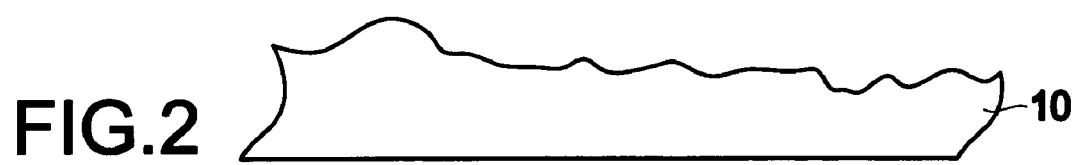
FIG. 2 is a cross-sectional schematic diagram of a partially completed layered structure.

The present invention generally relates to SiGe wafers that normally absorb some oxygen after experiencing an ambient environment. However, in expaxial processes, it is important to reduce the amount of oxygen on the substrate for a high quality epitaxial film to be grown. FIG. 1 illustrates a layer of SiGe 10 with an overlying oxide/oxygen region 12 that forms naturally in an ambient atmosphere containing oxygen ($O_2$ or $H_2O$). The circles within region 12 schematically illustrate oxygen atoms on the surface of the substrate 10. Region 12 is not actually a separate layer of the substrate 10, but instead is the upper surface region of the substrate 10 that contains the oxygen atoms. If there is a sufficient amount of oxygen within the region 12, this will detrimentally affect the growth of any epitaxial silicon on the silicon germanium layer 10. Therefore, as shown in FIG. 2, an etching and hydrogen pre-bake process can be utilized to remove the oxygen/oxide from region 12. However, by completely removing the oxygen/oxide region 12 with hydrogen pre-bake, the surface 20 of the SiGe layer 10 becomes rough, as shown in FIG. 2.

More specifically, a hydrogen pre-bake (such as an 800° C., 2 minute pre-bake) following an ex-situ HF etch are efficient methods to completely remove the remaining oxygen from region 12. However, while such a pre-bake removes all of the oxygen from region 12, it also makes the surface 20 very rough, as shown in FIG. 2. Once the oxygen is removed, the surface 20 becomes rough quickly. This is most likely due to oxide reducing the surface diffusivity of Si and Ge. The surface roughening is caused by surface Si, Ge diffusion.

Figure 3:
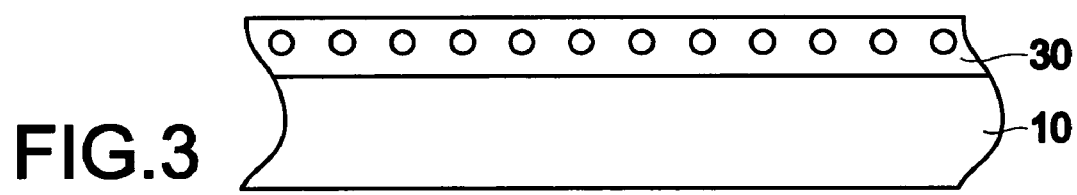
FIG. 3 is a cross-sectional schematic diagram of a partially completed layered structure.
Figure 4:
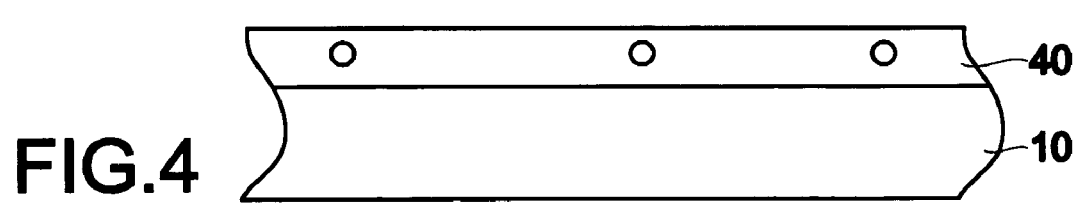
FIG. 4 is a cross-sectional schematic diagram of a partially completed layered structure.
Figure 5:
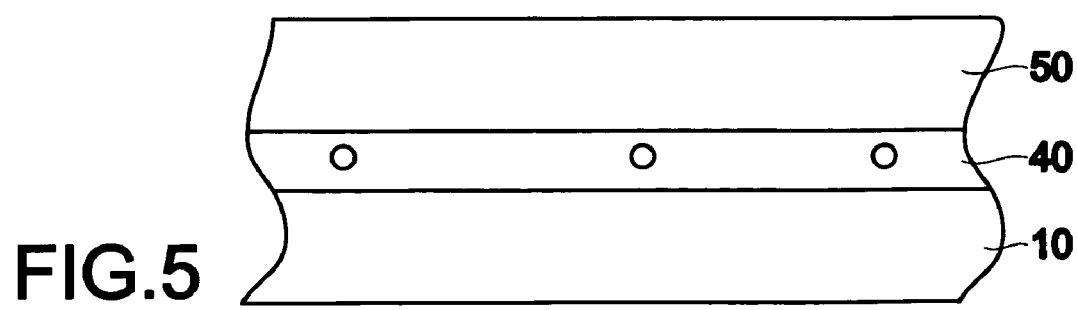
FIG. 5 is a cross-sectional schematic diagram of a partially completed layered structure.

To avoid this situation, the invention performs the processing shown in FIGS. 3–5 to allow a very small amount of oxygen to remain in region 12 (which is between approximately $1 \times 10^{13}/cm^2$ and approximately $5 \times 10^{13}/cm^2$ of oxygen).

A typical HF etch will remove most of the native oxide, but still leave a small amount of oxygen 30 at the SiGe surface as shown in FIG. 3. Note that there are substantially less oxygen atoms within region 30 in FIG. 3 than there were originally in region 12 in FIG. 1. Additional treatment is required in order to further reduce the residual surface oxygen level. Although hydrogen pre-baking is an efficient method for removing the remaining oxygen, the inventors have found that when all the oxygen on the surface is removed, the SiGe surface quickly becomes very rough (e.g., FIG. 2). This roughening can be measured, for example, by atomic force microscopy (AFM).

Further study indicated that the roughening of the SiGe surface is related to the surface oxygen removal. The measure of trace amounts of oxygen (and other elements) on a surface is typically given as the integral of the atomic concentration over the depth distribution and thus has the units of area density (atoms/$cm^2$) and one atomic layer is on the order of $1 \times 10^{15}$ atoms/$cm^2$. When a small amount of oxygen remains (>$5 \times 10^{12}/cm^2$), the surface stays smooth. Once this residual oxygen is removed, the surface quickly becomes rough at the pre-bake temperature. This is most likely because the surface diffusivity of Si and Ge is reduced due to the presence of the residual oxygen. The surface roughening is caused, in part, by surface Si and Ge diffusion. Rough semiconductor surfaces can interfere with the quality of thermally-grown gate oxide layers in FET processing as well as degrade the performance of CMOS device due to increased carrier scattering at the rough interface. High oxygen at Si/SiGe interface can create epitaxial growth defects in the Si layer and thus degrade the performance of the CMOS device. Therefore, there is a need to minimize the residual oxygen concentration on the surface of silicon germanium without significantly increasing the roughness of the surface.

Figure 6:
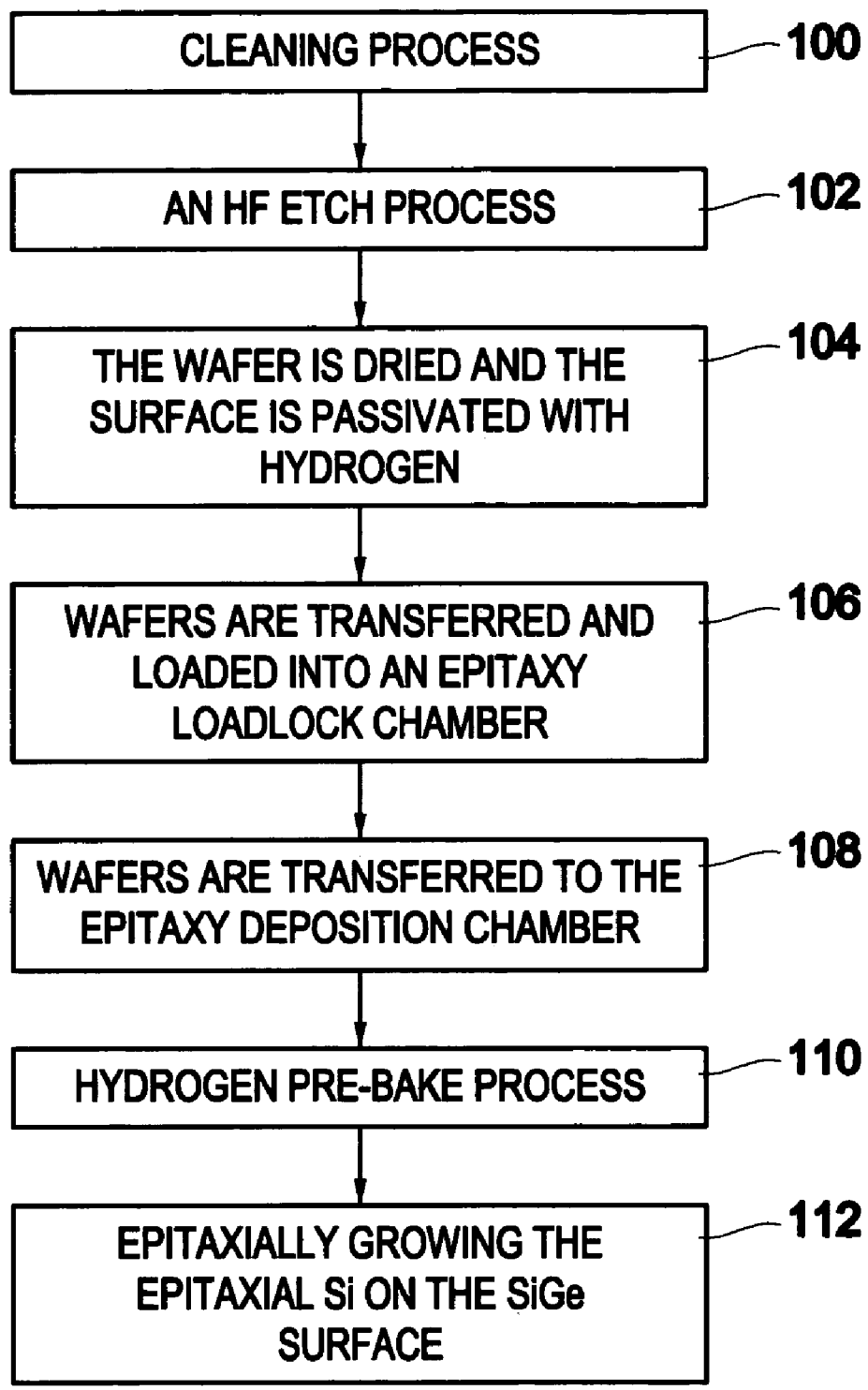
FIG. 6 is a flow diagram illustrating the invention.

As shown in FIG. 6, an HF etch process 102 is used first to remove most of the oxide on the surface. A diluted HF solution is typically used for this etching process, such as typically 10:1–500:1 H2O:HF solution, preferably 50:1–200:1H2O:HF solution. Cleaning processes 100 that remove particles, metals, organic contaminations can be performed before HF etch. After HF etch, the wafer is dried 104 without rinse (HF last), or it can be rinsed with diluted HCl solution (HCl last), or DI water before drying. HF last or HCl last process is preferred as it minimizes the reoxidation of the SiGe surface. The SiGe surface after this HF etch is passivated with hydrogen which slows down the reoxidation during the time the wafer is exposed to oxygen-containing environment, such as when it is transferred from the HF etch chamber to the epitaxy chamber. This HF etch process removes most of the oxide on the surface, however, small amount of oxygen remains on the surface, typically with a dose of $1 \times 10^{13}$–$1 \times 10^{15}/cm^2$ oxygen. The amount of remaining oxygen depends on the etching process and Ge content on the SiGe surface. The higher the Ge content, the more the remaining oxygen. An oxygen dose of $5 \times 10^{13}$–$2 \times 10^{14}/cm^2$ is typically observed on SiGe surface with 15–25% Ge content, while higher oxygen doses are possible with a non-optimized HF etch process. For a given HF etch process in the same facility and for the same Ge concentration, the remaining oxygen amount on the surface is usually very consistent.

The SiGe wafers are then transferred and loaded into an epitaxy loadlock chamber 106 within a time window. The time window can be as long as a few hours before the SiGe surface starts to be reoxidized significantly in the ambient. A time window of less than 1 hour is preferred to guarantee minimum reoxidation. The loadlock chamber of the epitaxy tool is purged with high-purity inert gas, such as high-purity nitrogen. A loadlock chamber that is capable of having the ambient evacuated (pumped loadlock) is preferred as it can quickly reduce the oxygen and moisture content in the loadlock to below the parts-per-million (ppm) level during a purge cycle. The wafers can then be transferred to the epitaxy deposition chamber 108.

An oxygen amount of >$1 \times 10^{14}/cm^2$ is too much oxygen to properly grow the epitaxial silicon. At this level of surface oxygen, regions exist on the surface where silicon atoms are displaced from their epitaxial positions by atomic-scale clusters of oxygen atoms. This local atomic displacement can create an error in the subsequent atomic ordering as the layer is grown thicker. A defect that is characteristic of this phenomenon is the so-called stacking fault tetrahedron or hillock defect.

A hydrogen pre-bake process 110 within the epitaxy deposition chamber or a separate baking chamber in the same tool is then used to further reduce the oxygen content on the surface. While hydrogen pre-bake is effective in removing the remaining oxygen on the surface, when all the oxygen on the SiGe surface is removed during the hydrogen bake, the surface quickly becomes rough. Further, we found the surface stays smooth when there is a small amount of oxygen remaining on the surface (>$5 \times 10^{12}$/cm2). For example, a 10 $\mu$m×10 $\mu$m AFM image taken before and after the hydrogen bake shows less than a 1 Å RMS roughness change for the samples with at least $5 \times 10^{12}$/cm2 oxygen remaining, whereas samples with no measurable remaining oxygen showed a roughness increase of more than 1 Å. The measured RMS roughness will continue to increase with increasing time or temperature in the case where there is no remaining oxygen on the surface. This is most likely due to oxygen reducing the surface diffusivity of Si and Ge. The surface roughening is caused by surface Si, Ge diffusion.

To avoid the surface roughening, the invention performs the hydrogen pre-bake process 110 that deliberately leaves a small amount of oxygen ($>5\times10^{12}$/cm2) by choosing an appropriate baking condition. Typically, a remaining oxygen dose of $1\times10^{13}$–$5\times10^{13}$/cm$^2$ is targeted to allow some process variation. This amount of oxygen constitutes about $\frac{1}{100}^{th}$ of an atomic layer and therefore minimizes the detrimental effect on the epitaxial silicon layer that is grown thereon.

The hydrogen pre-bake process 110 is carried out in an ultra-clean chamber, in an ultra-pure hydrogen environment, with less than 1 ppm of oxygen and moisture, preferably with less than 10 ppb of oxygen and moisture, in the temperature range of 700° C.–900° C., and pressure range of 1 mTorr–760 Torr, preferably 1 Torr–300 Torr, for 5 sec–10 min, preferably 30 sec–2 min. The combination of pressure, temperature, and bake time is chosen so that the hydrogen pre-bake process reduces the surface oxygen concentration to the target amount, but leaves at least $5\times10^{12}$/cm$^2$ remaining oxygen on the SiGe surface. By leaving a small amount of oxygen on the SiGe surface, the hydrogen pre-bake process avoids roughening the surface. Then, the process of epitaxially growing the epitaxial Si on the SiGe surface 112 is performed.

Thus, the invention provides a process that combines an HF etch and hydrogen pre-bake. The HF etch consistently leaves a first amount of oxygen on the surface. Then, this is followed with a hydrogen pre-bake, whose parameters are chosen to leave at least $5\times10^{12}$/cm$^2$ remaining oxygen on the surface (typically $1\times10^{13}$/cm$^2$–$5\times10^{13}$/cm$^2$). This is used successfully to keep the surface from roughening, while still reducing the total oxygen concentration from as high as $>1\times10^{14}$/cm$^2$ to low $10^{13}$/cm$^2$.

While only Si epitaxy on SiGe surface is discussed above, the invention is useful when epitaxially growing Si or SiGe on:SiGe (including SiGe on bulk substrate and SiGe on insulator), patterned Si (including strained Si on bulk substrate and on insulator), or patterned thin SOI (such as SOI with Si thickness less than 300 Å) surfaces, and avoids creating a rough surface upon which the epitaxial layer is grown.

The invention addresses a unique problem of hydrogen pre-bake of SiGe, patterned strained Si and patterned thin SOI films. This problem occurs when the surface oxygen is totally removed during hydrogen pre-bake, and the surface becomes rough.

However, with the invention, when there is a small amount of oxygen remaining on the surface, the diffusivity is low and the surface stays smooth. The use of the pre-bake process reduces the surface oxygen level, but intentionally leaves at least $5\times10^{12}$/cm$^2$ (typically between approximately $1\times10^{13}$/cm$^2$ and approximately $5\times10^{13}$/cm$^2$) of oxygen at the surface which prevents surface roughening. The invention controls the HF pre-clean and hydrogen pre-bake process to consistently leave a small amount of oxygen (typically between approximately $1\times10^{13}$/cm$^2$ and approximately $5\times10^{13}$/cm$^2$ of oxygen) on the surface to prevent surface roughening, while still reducing oxygen levels compared to SiGe surfaces without hydrogen pre-bake.

Thus, as shown above, the invention forms an epitaxial Si or SiGe layer on a SiGe, patterned strained Si, or patterned thin SOI surface and avoids creating a rough surface upon which the epitaxial layer is grown. In order to avoid creating a rough surface, the invention first performs an HF etching process on the SiGe, patterned strained Si, or patterned thin SOI surface. This etching process removes most of oxide from the surface, and leaves a first amount of oxygen (typically $1\times10^{13}$–$1\times10^{15}$/cm$^2$ of oxygen) on the SiGe, patterned strained Si, or patterned thin SOI surface. The invention then performs a heating process which heats the surface sufficiently in a hydrogen environment to remove additional oxygen from the surface and leaves a second amount of oxide, less than the first amount, on SiGe, patterned strained Si, or patterned thin SOI surface. The heating process leaves at least a dose of $5\times10^{12}$/cm$^2$ of oxygen (typically between approximately $1\times10^{13}$/cm$^2$ and approximately $5\times10^{13}$/cm$^2$ of oxygen) on the SiGe, patterned strained Si, or patterned thin SOI surface. By leaving a small amount of oxygen on the SiGe, patterned strained Si, or patterned thin SOI surface, the hydrogen pre-bake process avoids roughening the SiGe, patterned strained Si, or patterned thin SOI surface. Then, the process of epitaxially growing the epitaxial Si or SiGe layer on the SiGe, patterned strained Si, or patterned thin SOI surface is performed.

In addition to further reducing oxygen on the surface, the hydrogen pre-bake process is also observed to reduce the oxygen incorporation into the epitaxial layer grown on the surface. It is observed that without a hydrogen pre-bake, there is usually a high degree of oxygen incorporation into the epitaxial layer that is nearest the starting surface, typically $1\times10^{18}$–$5\times10^{19}$/cm$^3$ oxygen in the first 1–10 nm of epitaxial layer growth. The hydrogen pre-bake process described above can significantly reduce the oxygen incorporation into the epitaxial layer, with the oxygen level reduced to below SIMS detection level (typically $1\times10^{17}$–$1\times10^{18}$/cm$^3$) after a few nm of film growth.

In addition to what is described above, it is possible to use other chemical oxide removal processes instead of hydrofluoric acid etch. Such chemical oxide removal processes remove most of the oxide on SiGe and Si surfaces and leave a small and consistent amount of oxygen on the surface. For example, one can use a gaseous mixture of HF and ammonia to remove the surface oxide. This invention is also applicable to epitaxy of other Si-containing layers on top of SiGe, patterned strained Si, or patterned thin SOI surface. Such Si-containing layers include Si, SiGe (more specifically $Si_xGe_{1-x}$), $Si_xC_{1-x}$, or $Si_xGe_yC_{1-x-y}$.

While the invention has been described in terms of preferred embodiments, those skilled in the art will recognize that the invention can be practiced with modification within the spirit and scope of the appended claims.

What is claimed is:

1. A method of forming an epitaxial silicon-containing layer on a silicon germanium surface, said method comprising:
    performing an ex-situ chemical oxide removal process on said silicon germanium surface so as to partially remove oxygen from said silicon germanium surface and leave a first amount of oxygen on said silicon germanium surface;
    heating said silicon germanium surface sufficiently to remove additional oxygen from said silicon germanium surface and leave a second amount of oxygen, less than said first amount, on said silicon germanium surface; and
    epitaxially growing said epitaxial silicon-containing layer on said silicon germanium surface.

2. The method in claim 1, wherein said ex-situ chemical oxide removal and heating processes increase the roughness of said silicon germanium surface by less than 1 Å RMS.

3. The method in claim 1, wherein said silicon-containing layer comprises one of Si, $Si_xGe_{1-x}$, $Si_xC_{1-x}$, and $Si_xGe_yC_{1-x-y}$.

4. The method in claim 1, wherein said ex-situ chemical oxide removal comprises a hydrofluoric acid etch.

5. The method in claim 4, where said hydrofluoric acid comprises a $H_2O$:HF solution with ratio of 10:1 to 500:1.

6. The method in claim 1, wherein said first amount of oxygen is less than $1 \times 10^{15}/cm^2$.

7. The method in claim 1, wherein said second amount of oxygen is at least $5 \times 10^{12}/cm^2$.

8. The method in claim 1, wherein said second amount of oxygen is between approximately $1 \times 10^{13}/cm^2$ and approximately $5 \times 10^{13}/cm^2$.

9. The method in claim 1, wherein said heating process is performed in a hydrogen-containing ambient.

10. A method of forming an epitaxial silicon-containing layer on a silicon surface, said method comprising:
   performing an ex-situ chemical oxide removal process on said silicon surface so as to partially remove oxygen from said silicon surface and leave a first amount of oxygen on said silicon surface;
   heating said silicon surface sufficiently to remove additional oxygen from said silicon surface and leave a second amount of oxygen, less than said first amount, on said silicon surface; and
   epitaxially growing said epitaxial silicon-containing layer on said silicon surface.

11. The method in claim 10, wherein said silicon surface comprises one of a patterned strained silicon surface and a patterned thin silicon-on-insulator (SOI) surface.

12. The method in claim 10, wherein said ex-situ chemical oxide removal and heating processes increase the roughness of said silicon surface by less than 1 Å RMS.

13. The method in claim 10, wherein said silicon-containing layer comprises one of Si, $Si_xGe_{1-x}$, $Si_xC_{1-x}$, and $Si_xGe_yC_{1-x-y}$.

14. The method in claim 10, wherein said ex-situ chemical oxide removal comprises a hydrofluoric acid etch.

15. The method in claim 14, where said hydrofluoric acid comprises a $H_2O$:HF solution with ratio of 10:1 to 500:1.

16. The method in claim 10, wherein said first amount of oxygen is less than $1 \times 10^{15}/cm^2$.

17. The method in claim 10, wherein said second amount of oxygen is at least $5 \times 10^{12}/cm^2$.

18. The method in claim 10, wherein said second amount of oxygen is between approximately $1 \times 10^{13}/cm^2$ and approximately $5 \times 10^{13}/cm^2$.

19. The method in claim 10, wherein said heating process is performed in a hydrogen-containing ambient.

20. A method of forming an epitaxial silicon-containing layer on a silicon surface, wherein said silicon surface comprises one of a patterned strained silicon surface and a patterned thin silicon-on-insulator (SOI) surface, said method comprising:
   performing an ex-situ chemical oxide removal process on said silicon surface so as to partially remove oxygen from said silicon surface and leave a first amount of oxygen on said silicon surface;
   heating said silicon surface sufficiently to remove additional oxygen from said silicon surface and leave a second amount of oxygen, less than said first amount, on said silicon surface; and
   epitaxially growing said epitaxial silicon-containing layer on said silicon surface.

* * * * *